(12) United States Patent
Mikan et al.

(10) Patent No.: US 8,437,214 B2
(45) Date of Patent: May 7, 2013

(54) MEMORY CELL EMPLOYING REDUCED VOLTAGE

(75) Inventors: Donald Mikan, Austin, TX (US); Hugh Mair, Fairview, TX (US); Theodore W. Houston, Richardson, TX (US); Michael Patrick Clinton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/551,057

(22) Filed: Jul. 17, 2012

(65) Prior Publication Data

US 2013/0003471 A1  Jan. 3, 2013

Related U.S. Application Data

(62) Division of application No. 12/957,936, filed on Dec. 1, 2010, now Pat. No. 8,248,867, which is a division of application No. 12/142,334, filed on Jun. 19, 2008, now Pat. No. 7,864,600.

(51) Int. Cl.
*G11C 5/14* (2006.01)

(52) U.S. Cl.
USPC .......... 365/227; 365/189.15; 365/189.16; 365/154; 365/228

(58) Field of Classification Search ........... 365/227, 365/228, 189.15, 189.16, 154
See application file for complete search history.

(56) References Cited

U.S. PATENT DOCUMENTS

| | | | | |
|---|---|---|---|---|
| 7,586,780 B2 * | 9/2009 | Suzuki | ............ | 365/154 |
| 7,864,600 B2 * | 1/2011 | Mikan et al. | ............ | 365/189.14 |
| 7,936,589 B2 * | 5/2011 | Houston | ............ | 365/154 |
| 7,957,178 B2 * | 6/2011 | Houston | ............ | 365/154 |
| 7,983,071 B2 * | 7/2011 | Houston | ............ | 365/154 |
| 8,248,867 B2 * | 8/2012 | Mikan et al. | ............ | 365/189.14 |

* cited by examiner

*Primary Examiner* — Viet Q Nguyen
(74) *Attorney, Agent, or Firm* — Lawrence J. Bassuk; W. James Brady; Frederick J. Telecky, Jr.

(57) ABSTRACT

A memory array has a memory cell that comprises a storage element storing a logical state at a reduced voltage during at least one functional operation and a write access circuit configured to connect the storage element to at least a first write bit line in response to a write signal on the write word line for writing the logical state to the memory cell. The memory cell further comprises a read access circuit including an input node connected to the storage element and an output node connected to a read bit line of the memory array. The read access circuit is enabled and configured to read the logic state of the storage element in response to a read signal on the read word line. The reduced voltage is reduced relative to an operating voltage of at least one peripheral circuit associated with reading and/or writing of the memory cell.

2 Claims, 4 Drawing Sheets

MEMORY CELL EMPLOYING REDUCED VOLTAGE

This application is a divisional of prior application Ser. No. 12/957,936, filed Dec. 1, 2010, now U.S. Pat. No. 8,248,867, issued Aug. 21, 2012;
Which was a divisional of prior application Ser. No. 12/142,334, filed Jun. 19, 2008, now U.S. Pat. No. 7,864,600, granted Jan. 4, 2011.

FIELD OF THE INVENTION

The present invention relates generally to memory devices, and more particularly relates to a static memory cell architecture having memory cells employing reduced voltage.

BACKGROUND OF THE INVENTION

As integrated circuit technologies are scaled, stability in a static memory cell becomes a major concern affecting the design of reliable memory arrays, including, for example, static random access memory (SRAM) arrays. Most static memory cells employ a conventional six-transistor (6-T) architecture. While this memory cell arrangement offers a compact structure, the 6-T memory cell has many disadvantages, particularly its potential inability to scale with overall technology advancements due, at least in part, to stability problems which are often exacerbated as integrated circuit process dimensions shrink. Stability problems generally arise whenever stored voltages on internal nodes of the memory cell are disturbed. As process technologies scale, process-induced variations, as well as fundamental variation sources (e.g., dopant fluctuation effect on threshold voltage, etc.), may result in large threshold voltage variations across a given wafer. This threshold voltage scatter effect essentially magnifies the disturb voltage in 6-T memory cells, which can lead to stability failures in the SRAM array in which the 6-T memory cells are employed.

A recent trend is to employ an eight-transistor (8-T) architecture as illustrated in FIG. 1. The 8-T memory cell 10 is a read assist mechanism that advantageously eliminates disturbs in the memory cell during a read operation. The exemplary 8-T memory cell 10 comprises a static storage element 12 which is selectively connectable to first and second write bit lines (WBL) 14 and 16 via first and second N-channel metal-oxide semiconductor (NMOS) write access transistors 18 and 20, such that a source terminal of transistor 18 is connected to write bit line 14, and a drain terminal of transistor 18 is connected to a first internal node N1 of the storage element 12 and a source terminal of transistor 20 is connected to write bit line 16, and a drain terminal of transistor 20 is connected to a second internal node N2 of the storage element 12. Gate terminals of write access transistors 18 and 20 are connected to a corresponding write word line (WWL) 22 for conveying a write signal. The write access transistors 18 and 20 function to selectively connect the storage element 12 to the write bit lines 14 and 16 in response to the write signal. The static storage element 12 comprises first and second inverters 24 and 26, respectively, configured such that an output of the first inverter 24 is connected to an input of the second inverter 26 at node N2, and an output of the second inverter 26 is connected to an input of the first inverter 24 at node N1.

In order to eliminate read disturbs of the memory cell 10 during the read operation, the memory cell 10 includes a separate read access circuit 28 connected to a corresponding read bit line (RBL) 30 and read word line (RWL) 32 for selectively activating the read access circuit 28. The read access circuit 28 comprises first and second NMOS transistors 34 and 36, respectively, connected in a stacked arrangement. Specifically, a drain terminal of first NMOS transistor 34 is connected to the read bit line 30, a source terminal of the first NMOS transistor 34 is connected to a drain terminal of the second NMOS transistor 36, and a source terminal of the second NMOS transistor 36 is connected to ground. A gate terminal of the first NMOS transistor 34 is connected to the read word line 32 and forms a first input of the read access circuit 28, and a gate terminal of the second NMOS transistor 36 is connected to internal node N2 of the storage element 12 and forms a second input of the read access circuit 28.

When reading memory cell 10, an active read signal (e.g., VDD) is applied to the corresponding read word line 32, thereby turning on NMOS transistor 34 in the read access circuit 28. Furthermore, the read bit line 30 is precharged to a high voltage state. When a logical "1" is stored at node N2, NMOS transistor 36 in the read access circuit 28 is turned on, thereby creating an electrical path and allowing current to flow from the read bit line 30 through the read access circuit 28, when the corresponding read bit line 30 is raised above ground potential, between the read bit line 30 and ground through NMOS transistors 34 and 36. However, when a logical "0" is stored at node N2, transistor 36 is turned off and thus the electrical path between read bit line 30 and ground is effectively broken, thereby preventing current from flowing between the read bit line and ground. A sense amplifier, or alternative sensing circuitry, connected to the read bit line 30 is preferably operative to detect a voltage and/or current difference on the read bit line and to equate this difference with the logical state of the memory cell 10.

During the read operation, write access transistors 18 and 20, which are enabled during the write operation, are disabled, such as, for example, by applying a logical "0" to the corresponding write word line 22. Disabling write access transistors 18 and 20 during the read operation serves to electrically isolate the static storage element 12 from the corresponding write bit lines 14 and 16. Furthermore, since the gate terminal of transistor 36, which is connected to node N2 of the storage element 12, has a substantially high impedance, the internal node N2 is essentially electrically isolated from the read bit line 30 during both the read and write operations. The 8-T memory cell 10 provides a mechanism for reading the memory cell which is beneficially decoupled from the mechanism used to write to the memory cell.

Generally, some minimum retention voltage is required to retain memory in an SRAM cell, and some greater voltage is required for operation, either for stability or for performance (e.g. adequate read current). In some SRAM devices, a higher voltage has been applied to the SRAM cell during functional operations relative to the voltage applied in a stand-by mode. This reduces power in the stand-by mode but not during functional operations. The switching of voltage between stand-by mode and functional operations mode also incurs latency and dynamic power, creating a trade-off in the decision of when to switch to stand-by mode. Furthermore, different voltages have been applied to SRAM cells that are being written into verses cells that are being read or cells that are half accessed during a write. These changes of voltage incur power and require additional peripheral circuitry.

SUMMARY OF THE INVENTION

In one aspect of the invention, a memory array system is provided having a memory cell coupled to a read word line and a write word line of the memory array and peripheral circuits for reading and writing to the memory cell. The memory cell comprises a storage element for storing a logical state of the memory cell powered at a reduced voltage during at least one functional operation and a write access circuit configured to connect the storage element to at least a first write bit line in the memory array in response to a write signal on the write word line for writing the logical state to the memory cell. The memory cell further comprises a read access circuit including an input node connected to the storage element and an output node connected to a read bit line of the memory array. The read access circuit is enabled and configured to read the logic state of the storage element in response to a read signal on the read word line. The reduced voltage is a voltage that is reduced relative to a peripheral operating voltage of at least one peripheral circuit associated with reading and/or writing of the memory cell.

In another aspect of the present invention, a memory array system is provided having a plurality of memory cells each being connected to a read word line and a write word line and peripheral circuits for reading and writing to the plurality of memory cells. Each memory cell comprises a storage element for storing a logical state of the memory cell powered at a reduced voltage during functional operations and during stand-by mode, and a read access circuit including an input node connected to the storage element and an output node connected to a read bit line of the memory array. The read access circuit is enabled and configured to read the logic state of the storage element in response to a read signal on the read word line. The memory cell further comprises a write access circuit configured to connect the storage element to at least a first write bit line in the memory array in response to a write signal on the write word line for writing the logical state to the memory cell wherein the reduced voltage is a voltage that is reduced relative to a peripheral operating voltage of at least one peripheral circuit associated with writing of the memory cell. The reduced voltage is determined by a difference between an array source supply voltage (VDDAR) and an array sink supply voltage (VSSAR) and the peripheral voltage is determined by a difference between a peripheral source supply voltage (VDDP) and a peripheral sink supply voltage (VSSP) and the read access circuit is supplied by a read sink supply voltage (VSSRD).

In yet another aspect of the invention, a memory array system is provided having a plurality of memory cells each being connected to a read word line and a write word line and peripheral circuits for reading and writing to the plurality of memory cells. Each memory cell comprises means for storing a logical state of the memory cell, the means for storing being powered at a reduced voltage during functional operations and during memory retention. Each memory cell further comprises means for connecting the means for storing to at least a first write bit line in the memory array in response to a write signal on the write word line for writing the logical state to the memory cell and means for reading the logical state of the memory cell, the means for reading including an input node connected to the storage element and an output node connected to a read bit line of the memory array. The means for reading is enabled and configured to read the logic state of the storage element in response to a read signal on the read word line wherein the reduced voltage is a voltage that is reduced relative to a peripheral operating voltage of at least one peripheral circuit associated with reading and/or writing of the memory cell.

DETAILED DESCRIPTION OF THE INVENTION

The present invention will be described herein in the context of an illustrative static memory cell suitable for use, for example, in an SRAM array. It should be appreciated that the invention is not limited to this or any particular memory cell architecture. Rather, the invention is more generally applicable to techniques for advantageously allowing a memory cell to operate functionally at a reduced voltage relative to peripheral circuitry associated with reading and/or writing of the memory cell. Although the present invention will be illustrated with respect to an 8-T memory cell, it is to be appreciated that the present invention is also applicable to a 7-T memory cell (i.e., having only one write access transistor) or any number of transistor memory cell configurations that include a separate read access circuit that is isolatable from a separate write access circuit of the memory cell.

In accordance with an aspect of the invention, the memory cell includes a storage element configured to operate at a reduced voltage during both functional operations (i.e., read and write operations) and during stand-by mode to provide a memory cell that operates at reduced power. Stand-by mode is when a memory cell is retaining its current logic state and not being written to or read from. The reduced voltage is a voltage that is reduced relative to an operating voltage of at least one peripheral circuit associated with reading and/or writing of the memory cell. The storage element can also operate at a first reduced voltage for functional operations and for a second reduced voltage for stand-by mode, such that both the first and second reduced voltages are reduced relative at an operating voltage of at least one peripheral circuit associated with reading and/or writing of the memory cell. In one embodiment, the reduced voltage is substantially a minimum retention voltage that would be required to maintain a logic state of a memory cell. The minimum retention voltage may include some margin above the minimum voltage required to maintain a logic state of a memory cell to allow for fluctuations in fabrication and operation of a memory array(s).

Figure 1:
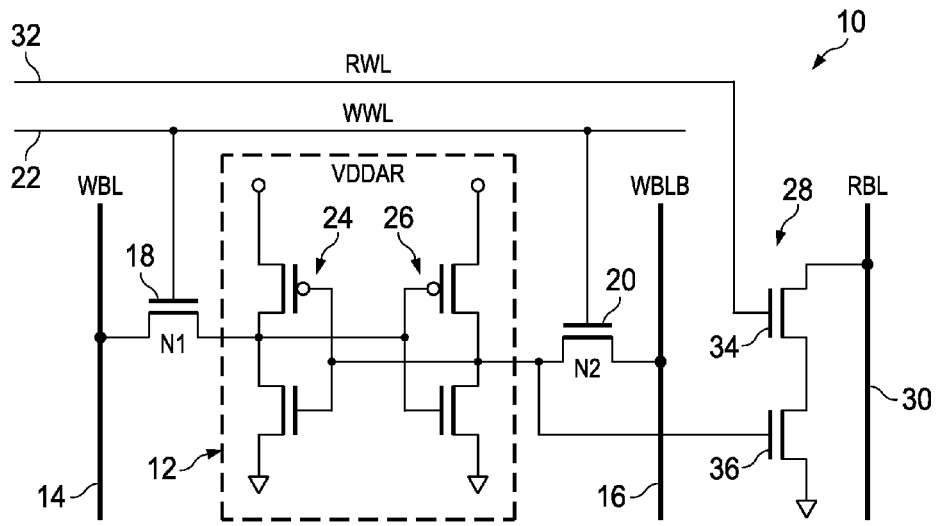
FIG. 1 is a schematic diagram illustrating a conventional eight-transistor static memory cell.
Figure 2:
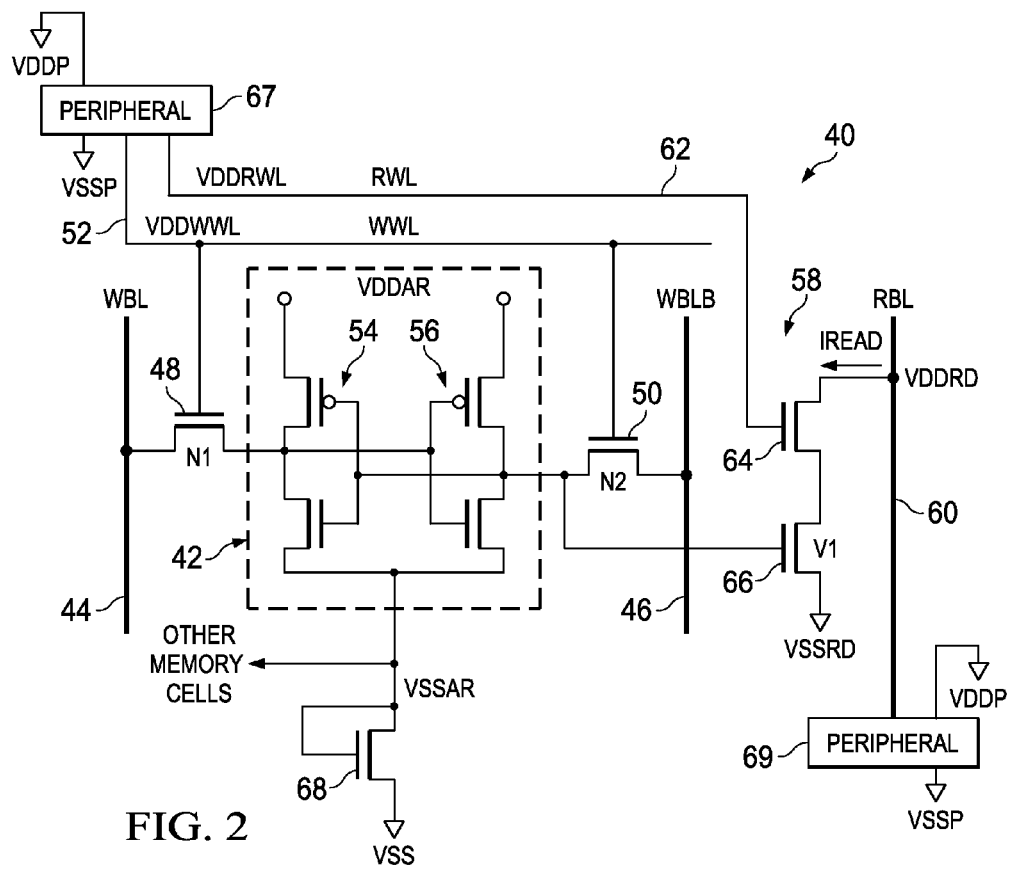
FIG. 2 is a schematic diagram illustrating an exemplary eight-transistor static memory cell in accordance with an aspect of the present invention.

FIG. 2 illustrates an 8-T memory cell 40 in accordance with an aspect of the present invention. The 8-T memory cell 40 includes a static storage element 42 which is selectively connectable to first and second write bit lines (WBL and WBLB) 44 and 46 via first and second N-channel metal-oxide semiconductor (NMOS) write access transistors 48 and 50, such that a source terminal of transistor 48 is connected to write bit line 44, and a drain terminal of transistor 48 is connected to a first internal node N1 of the storage element 42 and a source terminal of transistor 50 is connected to write bit line 46, and a drain terminal of transistor 50 is connected to a second internal node N2 of the storage element 42. Gate terminals of write access transistors 48 and 50 are connected to a corresponding write word line (WWL) 52 for conveying a write signal (VDDWWL). The write access transistors 48 and 50 function to selectively connect the storage element 42 to the write bit lines 44 and 46 in response to the write signal.

The static storage element 42 comprises first and second inverters 54 and 56, respectively, configured such that an output of the first inverter 54 is connected to an input of the second inverter 56 at node N2, and an output of the second inverter 56 is connected to an input of the first inverter 54 at node N1. The storage element is configured to be powered at a reduced voltage for at least one functional operation (e.g., write operation) relative to a peripheral voltage for powering one or more peripheral circuits 67 and 69. The reduced voltage is the difference between an array source supply voltage (VDDAR) and an array sink supply voltage (VSSAR) and the peripheral voltage is the difference between a peripheral source supply voltage (VDDP) and a peripheral sink supply voltage (VSSP). The reduced voltage may be derived from the peripheral voltage (e.g., VDDP and/or VSSP) or be provided by a separate supply than the peripheral voltage In order to eliminate read disturbs of the memory cell 40 during the read operation, the memory cell 40 includes a separate read access circuit 58 connected to a corresponding read bit line (RBL) 60 and read word line (RWL) 62 for selectively activating the read access circuit 58. The read access circuit 58 comprises first and second NMOS transistors 64 and 66, respectively, connected in a stacked arrangement. Specifically, a drain terminal of first NMOS transistor 64 is connected to the read bit line 60, a source terminal of the first NMOS transistor 64 is connected to a drain terminal of the second NMOS transistor 66, and a source terminal of the second NMOS transistor 66 is connected to read sink supply voltage (VSSRD). VSSRD may be supplied independently via a separate sink supply voltage or may be coupled to or derived from sink supply voltage VSSAR or VSSP. The read bit line 60 is set at a normally active high state by read source supply voltage (VDDRD). VDDRD may be supplied independently via a separate source supply voltage or may be coupled to or derived from source supply voltage VDDAR or VDDP A gate terminal of the first NMOS transistor 64 is connected to the read word line 62 and forms a first input of the read access circuit 68, and a gate terminal of the second NMOS transistor 66 is connected to internal node N2 of the storage element 42 and forms a second input of the read access circuit 58.

When reading memory cell 40, an active read signal ((VDDRWL) is applied to the corresponding read word line 52, thereby turning on NMOS transistor 64 in the read access circuit 58. When a logical "1" is stored at node N2, NMOS transistor 66 in the read access circuit 58 is turned on, thereby creating an electrical path and allowing current to flow from reference source through the read access circuit 58. However, when a logical "0" is stored at node N2, NMOS transistor 66 is turned off or the current reduced between the read bit line 60 and ground, thereby either preventing current or reducing the current flowing between the reference source and read bit line 60. A sense amplifier, or alternative sensing circuitry, connected to the read bit line 60 can be employed to detect a voltage and/or current difference on the read bit line and to equate this difference with the logical state of the memory cell 40. VDDRWL and VDDWWL may be supplied by or derived from the peripheral supply voltage (VDDP) or a separate supply voltage.

As illustrated in FIG. 2, the storage element 42 can be configured to operate at a reduced voltage during both functional operations (i.e., read and write operations) and during stand-by mode. The reduced voltage can be applied to the storage element by providing a reduction voltage, for example, a voltage drop across an NMOS control transistor 68. The source of the control transistor 68 is connected to a sink supply voltage (VSS) and the drain and gate of the control transistor 68 are connected to one another and to ends of both the first and second inverters 54 and 56 of the storage element 42. The source control transistor 68 provides a reduction voltage causing an increase in VSSAR relative to VSS. VSS can be provided from or derived from VSSP such that the difference between VDDAR and VSSAR is less than the difference between VDDAR and VSS or VDDAR and VSSP, thus providing a reduced voltage across the storage element 42 relative to the peripheral voltage. It is to be appreciated that the control transistor 68 can be located between VDDAR and a source supply voltage (VDD) that is provided from or derived from the VDDP with VSSAR being equal to VSSP. The reduction voltage is also provided to other memory cells of the memory array. It is to be appreciated that a variety of structures and configuration could be employed to provide a reduced voltage that is less than a peripheral voltage.

In another aspect of the invention, the storage element can operate at a first reduced voltage for functional operation and a second reduced voltage for memory retention, for example by a change in VDDAR or VSSAR by employing two different power sources. In one embodiment, the first reduced voltage would be greater than the second reduced voltage with both voltages being below the peripheral voltage of at least one peripheral circuit of the memory array 42.

The read access circuit 58 can configured to be operated at peripheral voltage with the storage element 42 being powered at a reduced voltage. For example, the peripheral voltage may be about 1 volt to about 1.2 volts and the reduced voltage may be about 0.6 volts to about 0.8 volts. In one aspect of the invention, the threshold voltage (VT) of the second NMOS transistor 66 of the read access circuit 58 is selected to have a VT that is greater than VSSAR, such that the second NMOS transistor will turn on and off in response to the different logical states of the storage element 42. However, the VT of the second NMOS transistor 66 can be selected to be substantially equal to or below VSSAR. In these latter cases, the NMOS transistor 66 may be conductive during a logic "1" and a logic "0" at different currents and provide different voltages at the read bit line 60. A sense circuit can be configured to sense the differences, for example, by limiting a time window for sensing a lowered read bit line voltage.

During the write operation, write access transistors 48 and 50, which are disabled during the read operation, are enabled, such as by applying a logical "1" to the corresponding write word line 52 to write the logic state residing on the first and second write bit lines 44 and 46 into the memory cell. One or more peripheral circuits 67 and 69 may provide a voltage on a write bit line and/or a write word line that is greater than the reduced voltage of the storage element.

Figure 3:
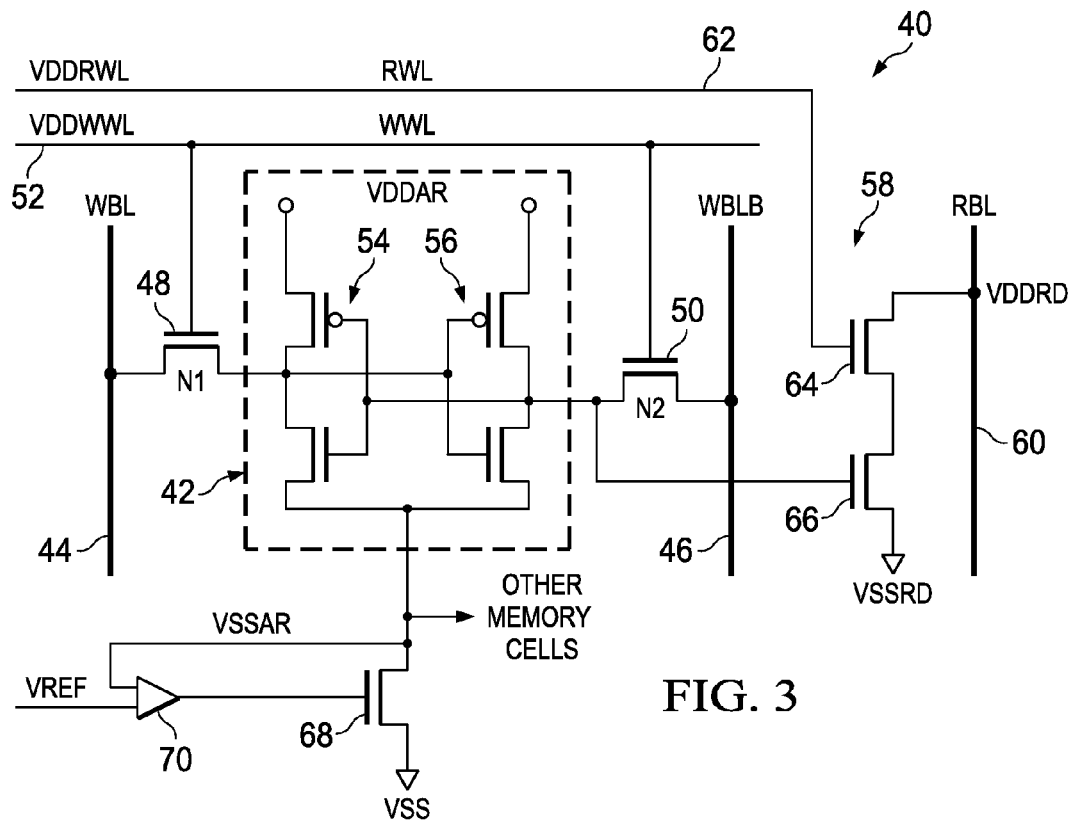
FIG. 3 is a schematic diagram illustrating an exemplary eight-transistor static memory cell in accordance with another aspect of the present invention.

FIG. 3 illustrates an 8-T memory cell 40 in accordance with another aspect of the present invention. The 8-T memory cell is similar to the memory cell of FIG. 2 where like reference numerals are employed for like parts. A peripheral circuit associated with the 8-T memory cell of FIG. 3 includes an operation amplifier 70 configured to control adjustment to the reduction voltage employing a reference voltage VREF. The reference voltage is provided to a first input of the operational amplifier 70 and VSSAR at the drain of the control transistor 68 is provided to a second input of the operational amplifier 70. The output of the operation amplifier 70 is provided to the gate of the control transistor 68. In this configuration, the reference voltage VREF can be adjusted to determine the maximum reduction voltage and minimum reduced voltage that can be employed to still provide proper functional operation and memory retention of the memory cell 40. The reduction voltage may be set relative to VSS or relative to VDDAR to provide a targeted voltage across the storage element 42. It is to be appreciated that the control transistor 68 can be located between VDDAR and a source supply voltage (VDD) that is provided from or derived from the VDDP as previously discussed with respect to FIG. 2.

Figure 4:
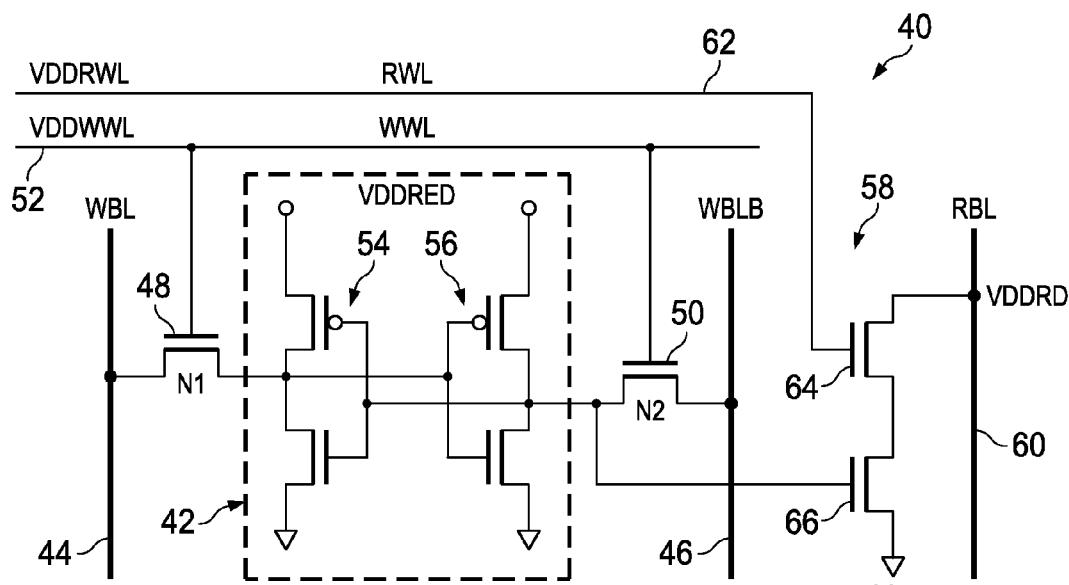
FIG. 4 is a schematic diagram illustrating an exemplary eight-transistor static memory cell in accordance with yet another aspect of the present invention.

FIG. 4 illustrates an 8-T memory cell 40 in accordance with yet another aspect of the present invention. The 8-T memory cell is similar to the memory cell of FIG. 2 where like reference numerals are employed for like parts. The memory element 42 of memory cell 40 is powered with a reduced voltage (VDDRED) during both functional operations and during stand-by mode. The reduced voltage VDDRED may be obtained from the periphery VDDP and/or VSSP with circuits similar to those for supplying VSSAR of FIG. 2 and FIG. 3, or may be obtained from a separate power supply.

It is to be appreciated that the read access circuit 58 can configured to be operated at the peripheral voltage, such that the second NMOS transistor 66 is coupled to VSSP and one or more peripheral circuits of the memory array provide a voltage to the read bit line and/or read bit line at VDDP. Alternatively, VSSRD may be supplied with some other voltage that may be greater or less than the VSSP. In particular, VSSRD may be tied to VSSAR. The value of VSSRD, VSSAR, VDDAR and the threshold voltage (VT) of the second NMOS transistor 66 of the read access circuit 58 can be selected such that the second NMOS transistor will turn on and off in response to the different logical states of the storage element 42. For a given Vt, the lower VSSRD is relative to VSSAR, the greater the off current. Also, the lower VSSRD is relative to VDDAR, the greater the read current. The VT of the second NMOS transistor 66 can be selected to allow different currents to flow through the NMOS transistor 66 and different currents and/or voltages to be provided on the read bit line 60 in response to a logic "1" and a logic "0" at the storage element. A sense circuit can be configured to sense the differences, for example, by limiting a time window for sensing a lowered read bit line voltage.

During the write operation, write access transistors 48 and 50, which are disabled during the read operation, are enabled, such as by applying a logical "1" to the corresponding write word line 52 to write the logic state residing on the first and second write bit lines and into the memory cell. One or more peripheral circuits of the memory array may provide a voltage on at least one of the write bit line and write word line of the memory cell that is greater than the reduced voltage of the storage element. It is to be appreciated that the storage element can operate at a first reduced voltage for functional operation and a second reduced voltage for memory retention, for example by employing two different power sources. In one embodiment, the first reduced voltage would be greater than the second reduced voltage with both voltages being below the peripheral operating voltage of at least one peripheral circuit of the memory array.

Figure 5:
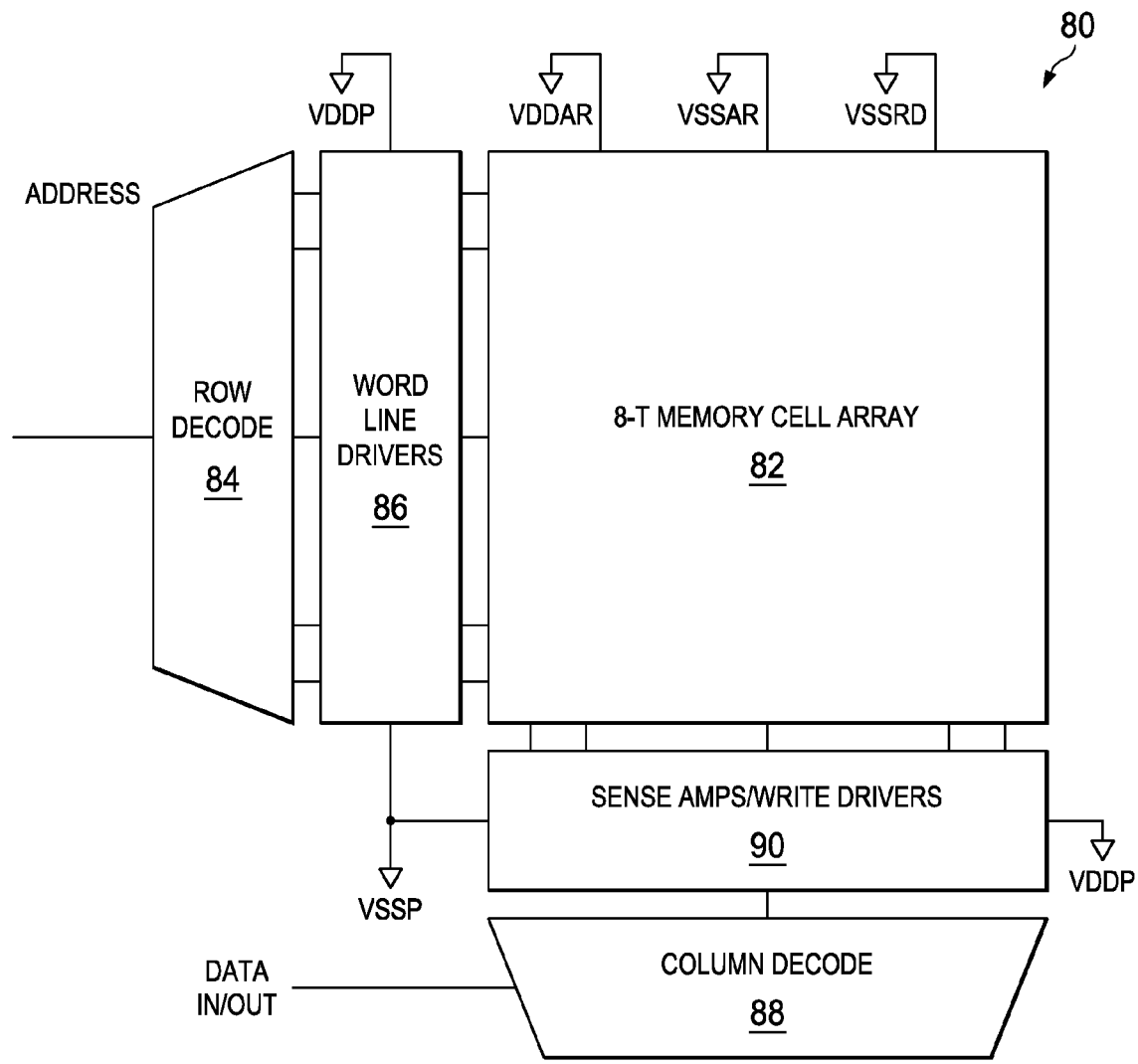
FIG. 5 is a block diagram depicting an 8-T SRAM memory array in accordance with an aspect of the invention.

FIG. 5 is a block diagram depicting an SRAM memory array system 80 with memory cells comprising a memory storage element, a write access and a read access separate from the write access, The memory cells are powered at a reduced voltage relative to at least one peripheral circuit of the memory array system 80 in accordance with an aspect of the invention. The memory array system 80 can be formed as an integrated circuit. The memory array system 80 includes a memory cell array 82 and peripheral circuitry for reading and writing to memory cells of the memory cell array 82. The memory array system 80 includes row decode circuitry 84 and word line drivers 86 coupled to the memory cells of the memory cell array 82 via at least one corresponding write word line and at least one corresponding read word line, and column decode circuitry 88 and sense amps/write drivers 90 connected to the memory cells via at least one write bit line and at least one read bit line. The memory cells are powered at a reduced voltage during at least one functional operation and during stand-by mode. The reduced voltage is established by the voltage difference between VDDAR and VSSAR. The memory cells may operate at different reduced voltages for functional operations and stand-by mode employing separate power sources.

VDDP is provided to the word line drivers 86 and sense amps/write drivers 90. VSSP is provided to the word line drivers and write drivers to establish a peripheral operating voltage (VDDP-VSSP) for the peripheral circuitry associated with writing to the memory cells. VSSRD is provided to the read access circuit of the memory cell. It is appreciated that the source and sink supply voltages may be increased or lowered to different levels as long as the voltage difference between the operating voltage of at least one peripheral circuit of the memory array is greater than the reduced voltage of the storage element.

Figure 6:
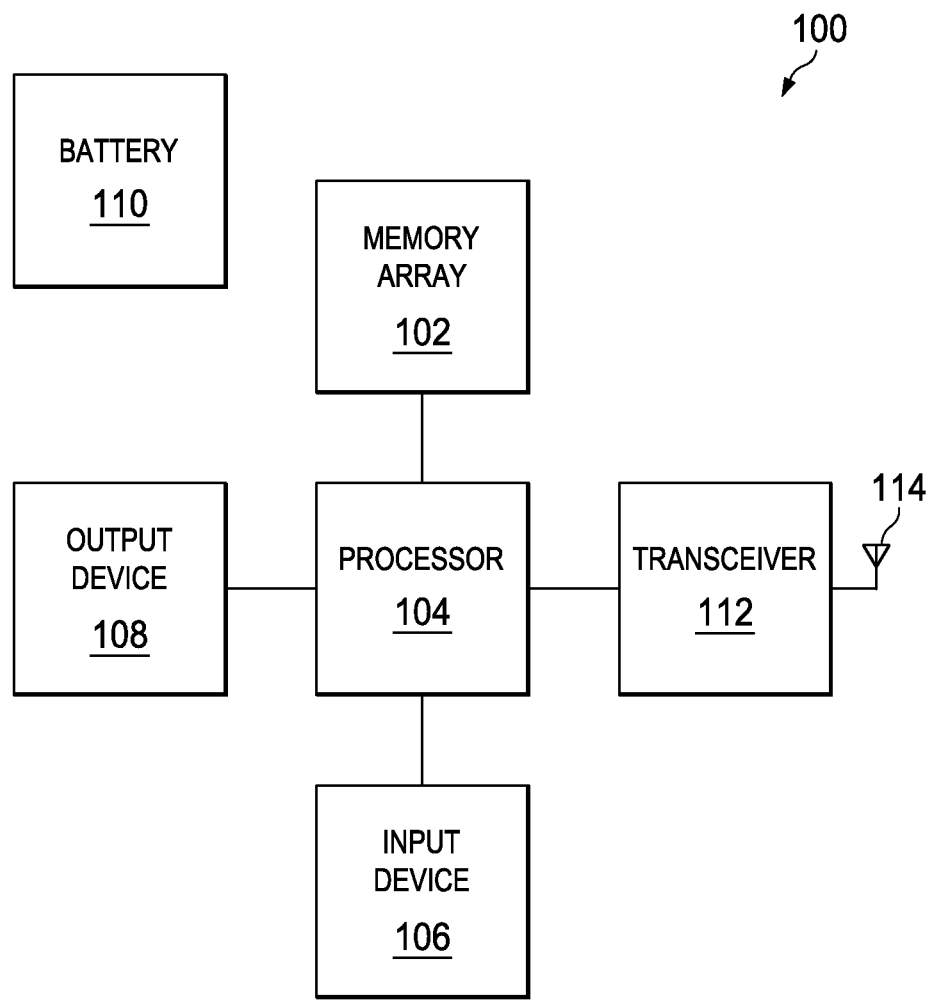
FIG. 6 illustrates a portable electronic device employing a memory array in accordance with an aspect of the present invention.

It is to be appreciated that a memory array 80 can be employed in a variety of different applications. FIG. 6 illustrates a portable electronic device 100 employing a memory array 102 with memory cells powered at a retention voltage in accordance with an aspect of the present invention. The portable electronic device 100 includes a processor 102 coupled to the memory array 102, an input device 106 (e.g., keyboard, keypad, touch screen) and an output device 108 (e.g., display, printer, peripheral device) both coupled to the processor 104 and a battery 110 for powering the components of the portable electronic device 100. The portable electronic device 100 may include a transceiver 112 and an antenna 114 for wireless transmission with one or more other devices.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations.

What is claimed is:

1. A memory array system having a plurality of memory cells each being connected to a read word line and a write word line and peripheral circuits for reading and writing to the plurality of memory cells, each memory cell comprising:
   A. means for storing a logical state of the memory cell, the means for storing being powered at a reduced voltage during functional operations and during stand-by mode;
   B. means for connecting the means for storing to at least a first write bit line in the memory array in response to a write signal on the write word line for writing the logical state to the memory cell; and
   C. means for reading the logical state of the memory cell, the means for reading including an input node connected to the storage element and an output node connected to a read bit line of the memory array, the means for reading being enabled and configured to read the logic state of the storage element in response to a read signal on the read word line wherein the reduced voltage is a voltage that is reduced relative to a peripheral operating voltage of at least one peripheral circuit associated with reading and/or writing of the memory cell.

2. The memory array system of claim 1, including means for adjusting the reduced voltage.

\* \* \* \* \*